United States Patent
Zhou et al.

(10) Patent No.: US 9,502,092 B2
(45) Date of Patent: Nov. 22, 2016

(54) UNIPOLAR-SWITCHING PERPENDICULAR MRAM AND METHOD FOR USING SAME

(71) Applicant: Avalanche Technology, Inc., Fremont, CA (US)

(72) Inventors: Yuchen Zhou, San Jose, CA (US); Zihui Wang, Milpitas, CA (US); Ebrahim Abedifard, San Jose, CA (US); Yiming Huai, Pleasanton, CA (US); Xiaojie Hao, Milpitas, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/975,419

(22) Filed: Dec. 18, 2015

(65) Prior Publication Data

US 2016/0180908 A1      Jun. 23, 2016

Related U.S. Application Data (60) Provisional application No. 62/095,667, filed on Dec. 22, 2014.

(51) Int. Cl.

| | |
|---|---|
| *G11C 11/00* | (2006.01) |
| *G11C 11/16* | (2006.01) |
| *H01L 43/02* | (2006.01) |
| *H01L 43/08* | (2006.01) |
| *H01L 27/22* | (2006.01) |

(52) U.S. Cl.
CPC ......... *G11C 11/1673* (2013.01); *G11C 11/161* (2013.01); *G11C 11/1675* (2013.01); *G11C 11/1677* (2013.01); *H01L 27/224* (2013.01); *H01L 27/226* (2013.01); *H01L 43/02* (2013.01); *H01L 43/08* (2013.01)

(58) Field of Classification Search
USPC .................................. 365/158, 148, 171, 163
See application file for complete search history.

(56) References Cited

U.S. PATENT DOCUMENTS 8,891,291 B2 *   11/2014   Zhou .................... G11C 11/161
                                                          365/148

* cited by examiner

*Primary Examiner* — Vu Le
(74) *Attorney, Agent, or Firm* — G. Marlin Knight; Bing K. Yen (57) ABSTRACT

MRAM devices that are switched by unipolar electron flow are described. Embodiments use arrays of cells that include a diode or transistor with a pMTJ. The switching between the high and low resistance states of the pMTJ is achieved by electron flow in the same direction, i.e. a unipolar flow. Embodiments of the invention include methods of operating unipolar MRAM devices that include a read step after a write step to verify the operation. Embodiments also include methods of operating unipolar MRAM devices that include an iterative stepped-voltage write process that includes a plurality of write-read steps that begin with a selected voltage for the write pulse for the first iteration and gradually increase the voltage for the write pulse for the next iteration until a successful read operation occurs.

9 Claims, 8 Drawing Sheets

UNIPOLAR-SWITCHING PERPENDICULAR MRAM AND METHOD FOR USING SAME

RELATED APPLICATIONS

Provisional Application 62/095,667 filed Dec. 22, 2014 is included by reference herein and benefit of the priority date is hereby claimed.

FIELD OF THE INVENTION

The present invention relates to the design and operation of magnetoresistive random access memory (MRAM) arrays that include magnetic tunnel junction (MTJ) memory devices.

BACKGROUND OF THE INVENTION

Figure 1:
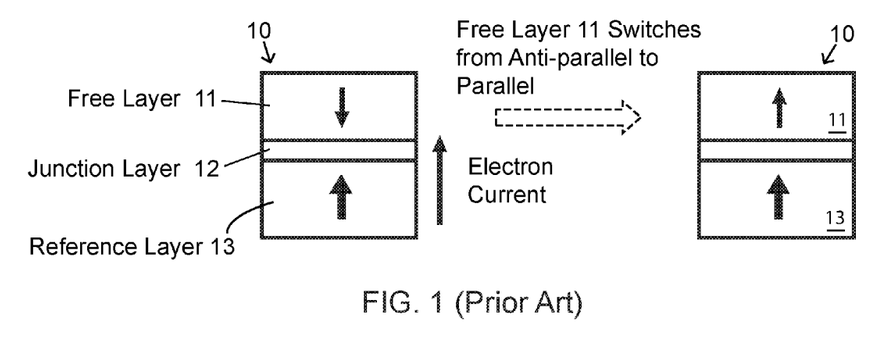
FIG. 1 is an illustration of the switching of the free layer in a prior art pMTJ memory element from antiparallel to parallel by driving the flow of electrons from the reference layer to the free layer.
Figure 2:
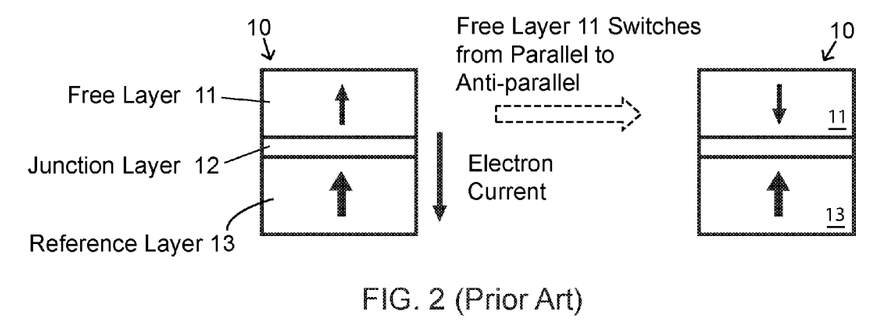
FIG. 2 is an illustration of the switching of the free layer in a prior art pMTJ memory element from parallel to antiparallel by driving the flow of electrons from the free layer to the reference layer.

As illustrated in FIG. 1, prior art pMTJ (perpendicular Magnetic Tunnel Junction) 10 includes a free layer 11, junction layer 12 and reference layer 13. The junction layer can also be referred to as a tunneling barrier layer. The magnetization direction of the free layer 11 is switchable as illustrated by the arrow between the up and down directions with respect to the plane of the thin films that are deposited and patterned on wafers to form the structures. Reference layer 13 has a fixed magnetization direction, which in this example is illustrated by the upward pointing arrow. On the left hand side of FIG. 1 the magnetization direction of the free layer 11 is antiparallel to that of the reference layer 13, which corresponds to the high electrical resistance state. In the prior art the free layer is switching from antiparallel to parallel by driving the flow of electrons from the reference layer 13 to the free layer 11. FIG. 2 is an illustration of the switching of the free layer in a prior art pMTJ memory element from parallel to antiparallel by driving the flow of electrons from the free layer to the reference layer. The use of opposite electron flows will be referred to as bipolar current switching. In prior art STT-MRAM the magnetic switching in both directions occurs by spin transfer torque (STT). The antiparallel to parallel switching is achieved by electrons carrying spin information from the reference layer to the free layer. The parallel to antiparallel switching is achieved by STT from electrons being reflected back from reference layer.

Figure 7:
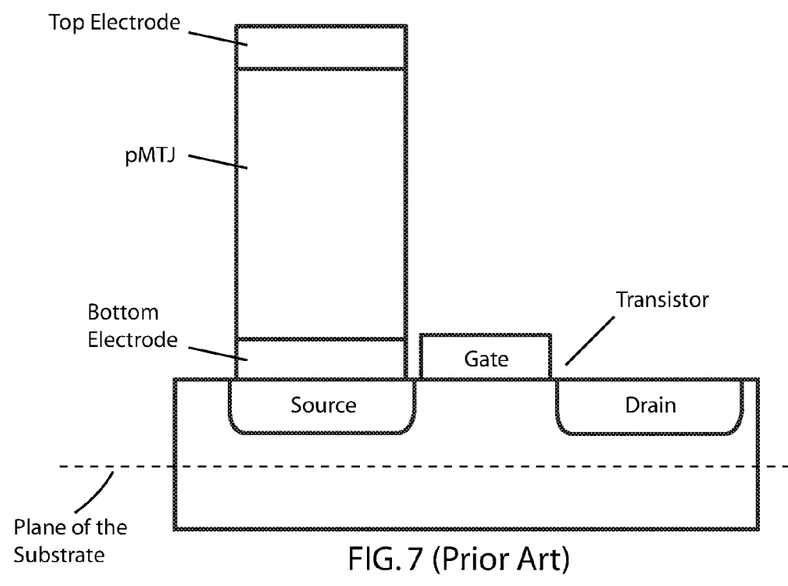
FIG. 7 is an illustration of a prior art pMTJ and the driver transistor.

Traditional STT-MRAM architecture uses cells that include one driver transistor for each MTJ (1-transistor+1-MTJ) as illustrated in FIG. 7. STT-MRAM area data density is limited due to the limitation on transistor current that is required to switch the magnetization of the free layer of the MTJ device, whereas a larger size transistor is needed to achieve the current level required to switch the MTJ. The transistor, therefore, occupies a larger in-plane area of the substrate. The in-plane direction of the substrate in FIG. 7 is horizontal. In contrast a diode has a much higher current limit for a comparable cross section area; therefore, a 1-Diode+1-MTJ architecture has advantages for minimal cell size and higher current during switching. However, the diode architecture allows current flow in only one direction and inherently requires unipolar current switching of the bipolar magnetizations of the MTJ. In prior art designs that use (1-Diode+1-MTJ) architecture and electric field effect to switch free layer magnetizations, due to the intrinsic physics limitations, the MTJ is required to have low coercivity field of the free layer or tilted free layer magnetization to achieve bipolar magnetization switching with a unipolar current. Such limitation leads to this architecture being impractical and unreliable in real world application.

SUMMARY OF THE INVENTION

The embodiments of the present invention described herein include MRAM devices with arrays of cells that include a diode selecting device in series with a pMTJ, which will referred to as 1-Diode+1-pMTJ architecture or more briefly diode-pMTJ architecture. The switching between the high and low resistance states of the pMTJ is achieved by electron flow in the same direction, i.e. a unipolar flow. Embodiments of the invention include methods of operating diode-pMTJ devices that include a read step after a write step to verify the operation. Embodiments of the invention also include methods of operating diode-pMTJ devices that include an iterative stepped-voltage write process that includes a plurality of write-read steps that begin with a selected voltage for the write pulse for the first iteration and gradually increase the voltage for the write pulse for the next iteration until a successful read operation occurs. In an alternative embodiment the stepped-voltage write process can be used only when switching from the low (P) to the high (AP) resistance state. Alternative embodiments can also use different writing pulse widths for the two switching operations to reduce writing errors.

The present invention described herein employs a recently discovered pMTJ property that allows a relatively high voltage to switch a pMTJ from the parallel (P) state to the antiparallel (AP) state by driving electrons from the reference layer to the free layer. This switching mode does not follow from the STT effect because the electron spin is in the opposite direction needed to explain the effect. Although the physical mechanism involved may not be completely understood, it is believed to be a field-like torque (FLT) effect that is both larger and exerted in the opposite direction to the STT effect under the particular conditions. This non-STT switching effect, which occurs under the conditions described, will be referred as an FLT effect for convenience, and regardless of the theoretical mechanism, the effect can be successfully used in MRAM architectures according to the invention. Because P→AP switching using the FLT effect uses electron flow that is in the same direction as that required for AP→P switching with STT, the unipolar design according to the invention is enabled. The FLT and STT switching in embodiments of the invention occur in two different, non-overlapping voltage ranges.

Embodiments of the invention can use standard prior art perpendicular MTJs (pMTJs), but certain parameter adjustments can also be made to improve performance. Embodiments will be described that include pMTJs with a free layer with a switchable perpendicular magnetization and a reference layer with a fixed perpendicular magnetization. The pMTJ free layer magnetization switches to parallel (P state) to the reference layer magnetization from being antiparallel (AP state) to the reference layer magnetization at a lower current or voltage value with electrons moving from the reference layer to the free layer. The pMTJ free layer switches from P state to AP state at a higher current or voltage value with electrons still moving from RL to the free layer direction.

In the present invention, unlike the prior art, the free layer can have strong perpendicular anisotropy and well oriented perpendicular magnetization direction. Thus, unipolar switching of P and AP states of STT-MRAM pMTJ can be achieved with practical performance and reliable switching behavior.

In alternative embodiments the diode selecting device can be replaced with a bipolar transistor.

DETAILED DESCRIPTION OF THE INVENTION

Figure 8:
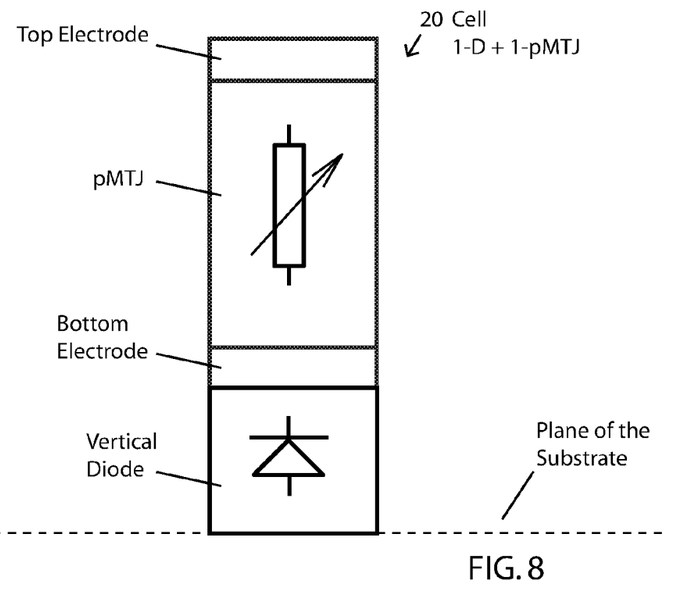
FIG. 8 is an illustration of an MRAM cell according to an embodiment of the invention that includes a pMTJ and a vertical diode.

As illustrated in FIG. 8 a pMTJ cell typically includes a top electrode and a bottom electrode. A memory cell 20 according to an embodiment of the invention includes a vertical diode in series with the bottom electrode. The use of a diode in place of the driver transistor allows a much higher current limit for a comparable cross section area than designs using a transistor. Whereas the driver transistor occupies a larger in-plane cross section area than the pMTJ cell as illustrated in FIG. 7, an embodiment of the architecture according to the invention allows the vertical diode to occupy substantially the same in-plane cross section area as the pMTJ cell as illustrated in FIG. 8. The in-plane direction of the substrate in FIGS. 7-8 is horizontal across the page. The multiple layers in the memory cell 20 can be formed in a pillar-like structure on a substrate, which is slightly wider at the bottom than at the top electrode using standard patterning techniques. In such an embodiment a vertical plane of the wafer or chip would show that the in-plane area of the diode is substantially the same as bottom electrode. The details of the shape of the stack of layers used for the memory cell are not critical for the invention. Regardless, the details of the shape of the pillar-like structure, a vertical diode implementation can be designed to occupy substantially less in-plane area than designs using transistors. Therefore, the 1-Diode+1-MTJ architecture has advantages for minimal cell size and higher current during switching.

Figure 3:
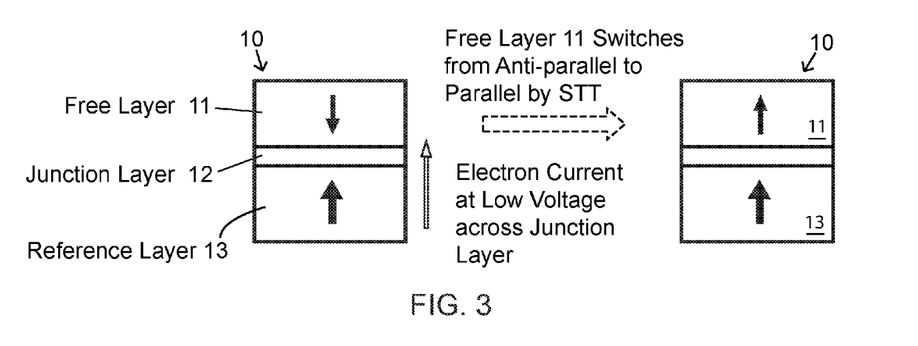
FIG. 3 is an illustration of the switching of the free layer by STT effect in an pMTJ memory element from antiparallel to parallel by driving the flow of electrons from the reference layer to the free layer using a selected relatively low voltage according to an embodiment of the invention.
Figure 4:
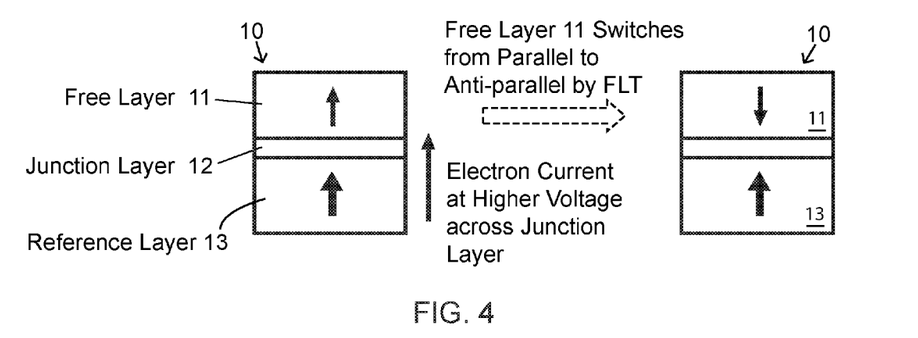
FIG. 4 is an illustration of the switching of the free layer by FLT effect in a pMTJ memory element from parallel to antiparallel by driving the flow of electrons from the reference layer to the free layer at a substantially higher voltage than is used for antiparallel to parallel switching according to an embodiment of the invention.

In the following description the unipolar switching will be described in various places referring to electron flow, or equivalently electrical current flow, which by convention is defined to be in opposite direction from electron flow. Similarly voltages used to induce electrical current flow will also be used to describe embodiments of the invention. FIG. 3 is an illustration of the switching of the free layer by STT effect in a pMTJ 10 memory element from antiparallel to parallel by driving the flow of electrons from the reference layer 13 to the free layer 11 using a selected relatively low voltage, which will be explained below. FIG. 4 is an illustration of the switching of the free layer by FLT effect in pMTJ memory element 10 from parallel to antiparallel by driving the flow of electrons from the reference layer to the free layer at a substantially higher voltage than is used for antiparallel to parallel switching.

Figure 5:
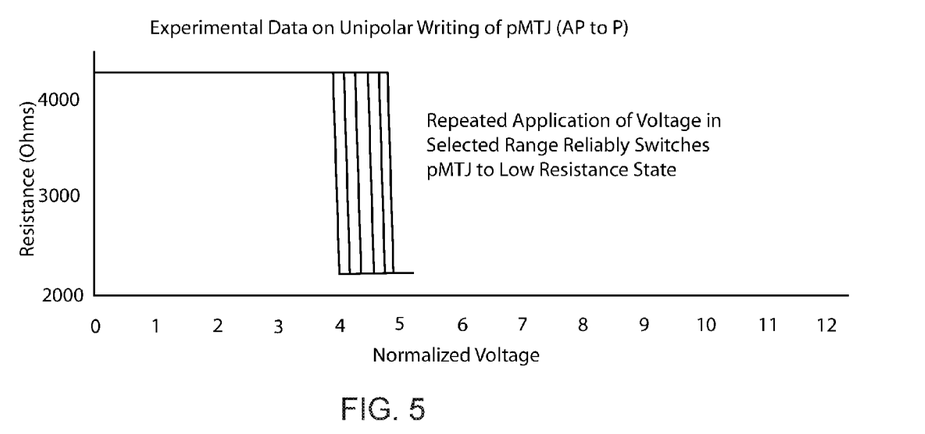
FIG. 5 is a graph illustrating experimental data obtained by applying writing pulses of a selected voltage range to a pMTJ initially in the high resistance (AP) state to attempt to switch to the low resistance (P) state according to an embodiment of the invention.
Figure 6:
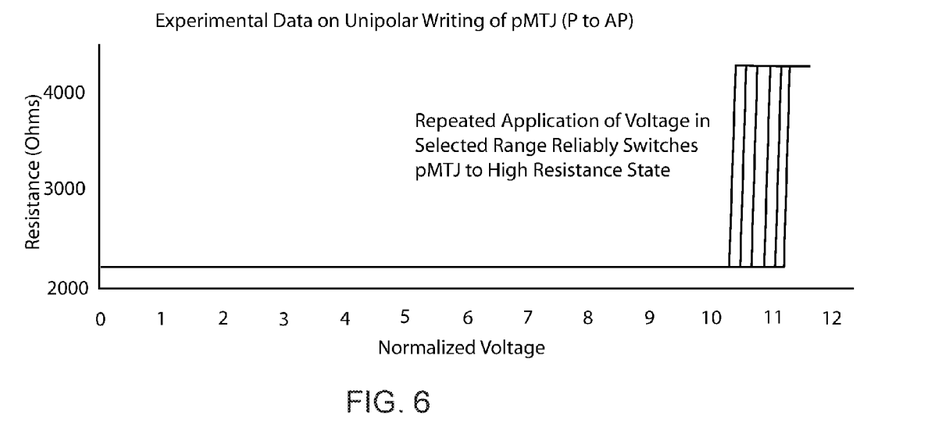
FIG. 6 is a graph illustrating experimental data obtained by applying writing pulses of a selected voltage range to a pMTJ initially in the low resistance (P) state to attempt to switch to the high resistance (AP) state according to an embodiment of the invention.

FIG. 5 illustrates an exemplary range of normalized voltages for switching the pMTJ from antiparallel (AP) state that has a higher resistance across the pMTJ cell, to parallel (P) state that has a lower resistance across the pMTJ cell, which is the lower of two voltage ranges that are used. Normalized voltage is used to show that switching from high resistance (AP) state to the low resistance (P) state with normal spin transfer torque (STT) occurs at a selected voltage that is ~40% of the voltage required to switch from low resistance to high resistance as illustrated in FIG. 6 for a given pMTJ. Thus, the switching from P to AP is achieved by applying a voltage that is selected to be substantially higher than the lower voltage used for AP to P switching. Various pMTJ designs can be used that will have different resistance-area (RA) product, and, therefore, the actual voltage required to switch from high resistance to low resistance will vary according to the particular embodiment, but the ratio of the two switching voltages will not change substantially. The actual switching voltages for a particular embodiment can be determined empirically.

Figure 9:
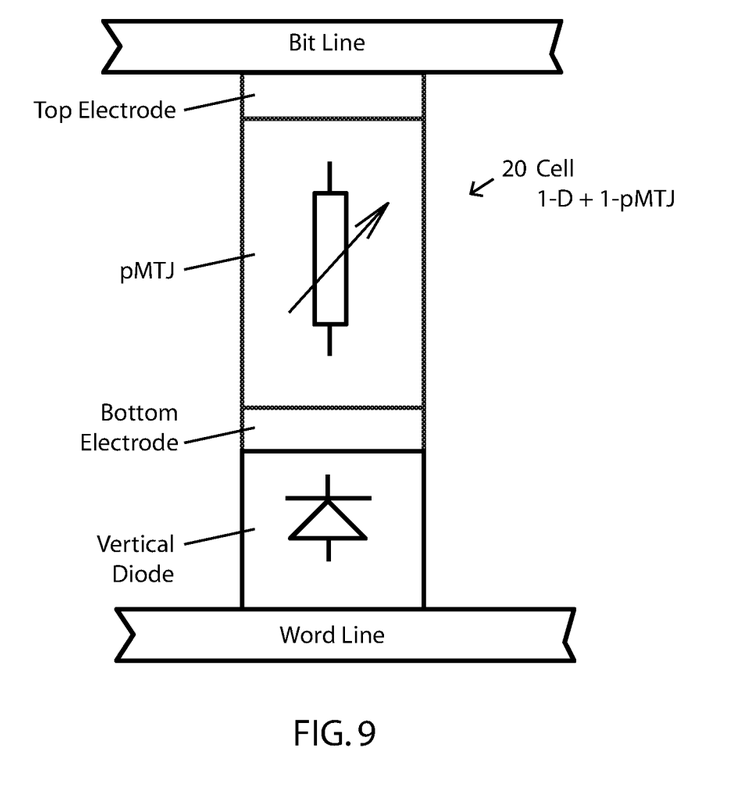
FIG. 9 is an illustration of an MRAM cell according to an embodiment of the invention that includes a pMTJ and a vertical diode as connected to a word line and a bit line.
Figure 10:
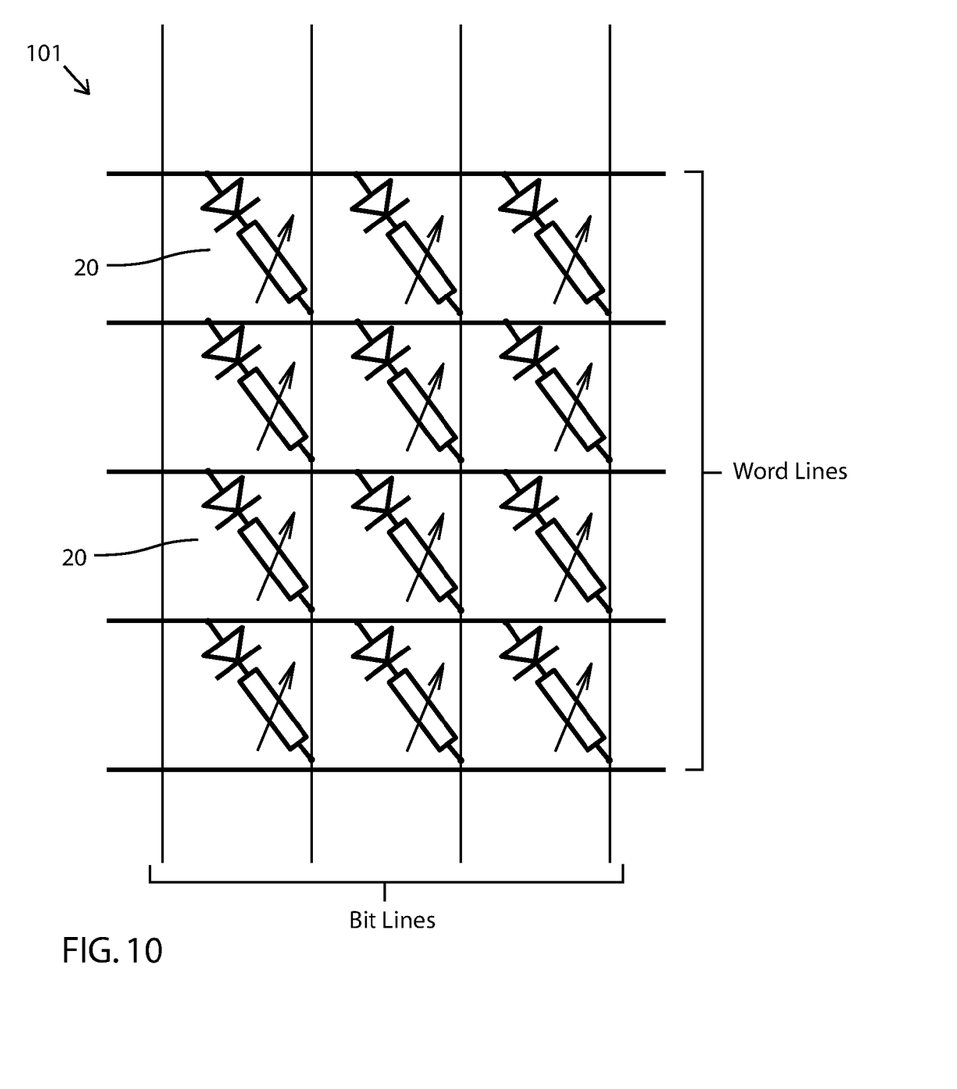
FIG. 10 is an illustration of an array of MRAM cells according to an embodiment of the invention as connected to word lines and bit lines.

FIG. 9 is an illustration of an MRAM cell 20 according to an embodiment of the invention that includes a pMTJ and a vertical diode selecting device as connected to a word line and a bit line. The bit line is connected to the top electrode. The word line is connected to the vertical diode, which is oriented to allow electrical current flow in one direction only from the word line through the pMTJ. The electron flow is, of course, in the opposite direction. FIG. 10 is an illustration of an array 101 of MRAM cells 20 according to an embodiment of the invention as connected to word lines and bit lines. A practical embodiment of an array will, of course, include a much larger number of cells, bit lines and word lines according to standard prior art design practice. The diodes act to limit leakage current into neighboring pMTJs and avoid the half-selection and neighboring bits disturb problems during read/write operations.

Figure 12:
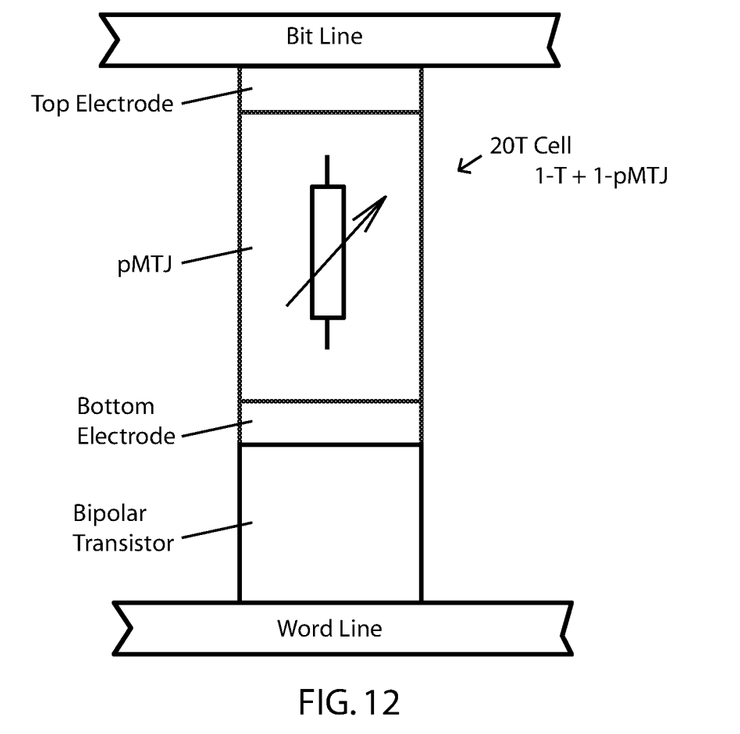
FIG. 12 is an illustration of a memory cell 20T that includes a bipolar transistor selecting device according to an embodiment the invention.

Alternative embodiments of cell can replace the diodes with bipolar transistors as the selecting device to avoid sneak path leakage. The unipolar design can otherwise remain as described above. FIG. 12 is an illustration of a memory cell 20T that includes a bipolar transistor according to an embodiment the invention.

Figure 13:
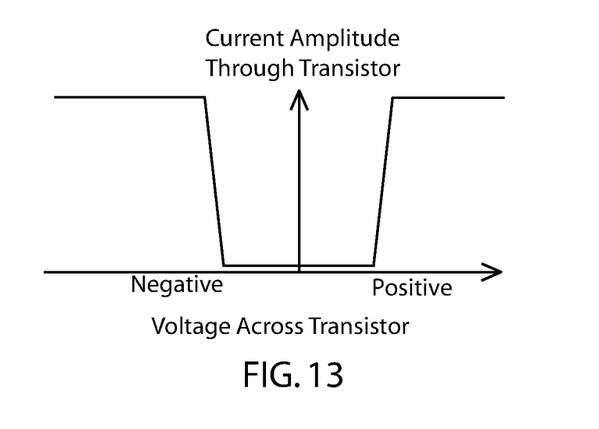
FIG. 13 is an illustration of the current flow through a bipolar transistor of the type used in memory cell 20T.

A bipolar transistor in series with pMTJ has the characteristics of having voltage thresholds between the bottom electrode and the word line for both positive and negative voltage polarities as illustrated in FIG. 13. When the applied voltage exceeds the thresholds, current through the transistor increases by >3 orders of magnitude, like in a diode, but current flows in both directions.

Operation of a memory cell according to an embodiment of the invention will now be described. The terms "writing" and "programming" will be used as synonymous with "switching." The lower switching voltage (Vp) (as measured at the word line) to switch the pMTJs from high resistance (AP) to low resistance (P) for a practical embodiment is expected to be in the range of 100-500 mV. The higher switching voltage for FLT switching is preferably 2×Vp or higher. The higher FLT switching voltage on the word line will switch the pMTJs from low resistance (P) to high resistance (AP). The low and high switching voltages are of the same sign and are both positive voltages in this embodiment. The diode is oriented to allow electrons to flow from reference layer to free layer during writing and reading operations.

Figure 11:
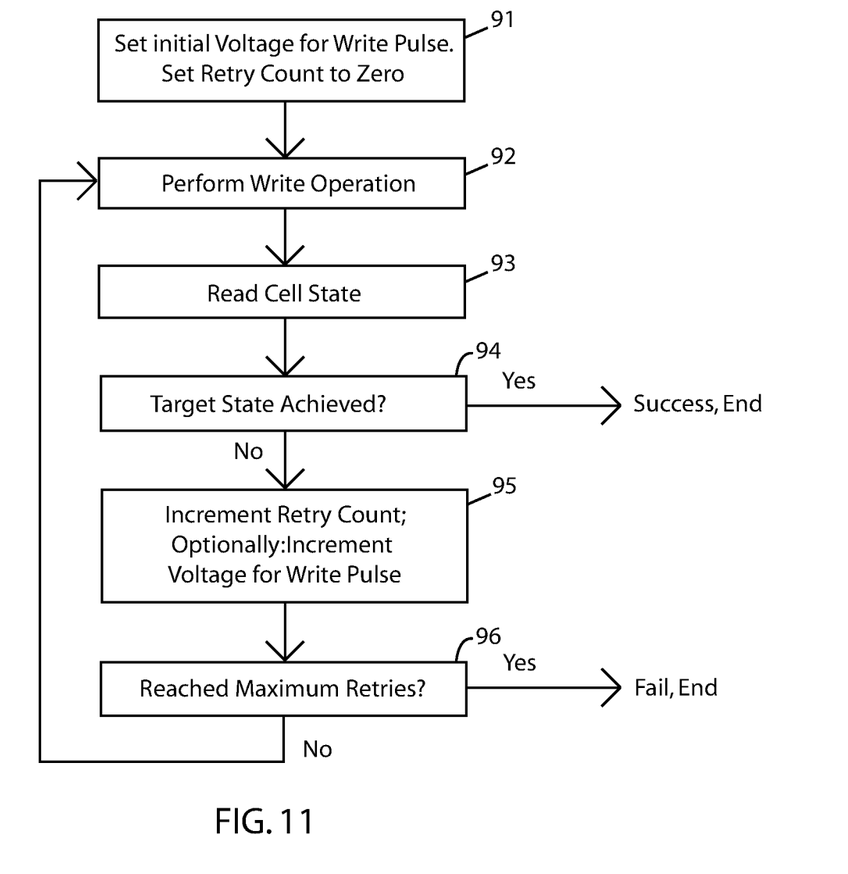
FIG. 11 is a flowchart illustrating a method of operating an MRAM according to an embodiment of the invention that includes iteratively writing then reading to verify the operation and optionally increasing the write pulse voltage for the next iteration if needed.

There are two optional or alternative techniques that can be included in the writing process to decrease the write-error-rate (WER) and improve reliability. FIG. 11 is a flowchart illustrating both techniques. One technique is to perform a read operation after each write (switching) operation to confirm the target resistance state has been successfully achieved is performed. This will be called a write-verify operation. In a preferred alternative embodiment write-verify is performed for both P→AP and AP→P switching. The write-read process is repeated until a successful verification or the maximum predetermined retries have been performed. If the maximum is reached a failure is then reported using the available error reporting means.

The second technique, which enhances the write power, increases (steps up) the voltage amplitude of the write pulse after a write failure. This will be called the voltage step-up process. FIG. 11 is a flowchart illustrating the write-verify process with the optional voltage step-up process. The retry count is set to zero and a selected initial write voltage is used for the first pass 91. The write operation on the cell is performed 92 and the state of the cell is read 93. If the read verify finds that target state has been successfully written, then the process ends with a reported success 94. If the read verify shows that the write failed, then the retry count is incremented and optionally the voltage amplitude is incremented 95. The retry count is tested for reaching the maximum 96, and if not, then the process loops back to the write operation 92 and the body of the loop is repeated. A maximum number of retries or equivalently a maximum voltage is used to end the iterative process and report failure.

The voltage step-up process is particularly preferred for the P→AP switching using the FLT effect because intrinsic probability of the FLT switching using the higher voltage range may be lower than is required for the specified device performance. As an example a write-error-rate (WER) of $10^{-6}$ or less can be required for the device, but a single write attempt using the FLT for some standard (un-optimized) pMTJs might succeed only 90% of the time, which is inadequate by many orders of magnitude. However, the write verify with voltage amplitude step-up process can be employed to reduce the WER to acceptable levels of $10^{-6}$ or less.

It is also possible to adjust the parameters of the pMTJs to optimize the design for use in a unipolar system according to the invention. For example, material composition of the reference layer and free can be adjusted to increase the FLT effect, such adjustment can include, but not limited to, using a material promoting spin-orbital effect, for example higher Fe content at interface of the free layer and reference layer facing the junction layer.

The pulse used to write the pMTJ is characterized by a voltage amplitude and pulse width. The write pulse width during switching AP→P at the lower voltage in embodiments of the invention may be selected to have a different pulse width than when switching P→AP at the higher voltage, where the different pulse width helps make P→AP and AP→P voltage limits being further away from each other to reduce write error. For example, using a longer pulse width for the AP→P switching could result in a lower voltage being usable, which in turn could reduce the WER by increasing the delta between the low and high writing pulses.

Although the present invention has been described in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

The invention claimed is:

1. An MRAM device with a memory cell that includes a Magnetic Tunnel Junction (MTJ) coupled to a selecting device, including:
   the MTJ having at least one reference layer (RL) with a fixed perpendicular magnetization, at least one free layer (FL) with a switchable perpendicular magnetization, and a junction layer between the reference layer;
   a bit line connected to an electrode of the MTJ; and
   a word line connected to the selecting device,
   wherein a first write process switches the free layer magnetization from anti-parallel to the reference layer magnetization to parallel to the reference layer magnetization by applying a first voltage pulse having a first amplitude between the bit line and the word line; and
   wherein a second write process switches the free layer magnetization from parallel to the reference layer magnetization to anti-parallel to the reference layer magnetization by applying a second voltage pulse having a second amplitude between the bit line and the word line; the first and second voltage pulses inducing electrons to move from the reference layer to the free layer, and the second amplitude being higher than the first amplitude.

2. The device according to claim 1, wherein the selecting device is a diode that is electrically connected in series with the MTJ between the word line and the bit line.

3. The device according to claim 1, wherein the selecting device is a bipolar transistor that is electrically connected in series with the MTJ between the word line and the bit line, whereas the bipolar transistor having the characteristic of passing current under both positive and negative polarities with larger than three orders of magnitude when the voltage amplitude across the bipolar transistor exceeds a threshold value, than when the voltage amplitude is lower than the threshold.

4. The device according to claim 1, wherein the first write process uses a first write pulse with a first pulse width having the first voltage amplitude, and the second write process uses a second write pulse with a second pulse width having the second voltage amplitude.

5. The device according to claim 4, wherein the first pulse width is different than the second pulse width.

6. The device according to claim 1, wherein the second write process includes determining success or failure of the switching of the free layer magnetization to anti-parallel to the reference layer magnetization by performing a read operation.

7. The device according to claim 6, wherein the second write process includes increasing the second voltage amplitude and repeating the second write process if failure of the switching is determined.

8. The device according to claim 1, wherein the first write process includes determining success or failure of the switching of the free layer magnetization to parallel to the reference layer magnetization by performing a read operation.

9. The device according to claim 8, wherein the first write process includes increasing the first voltage amplitude and repeating the first write process if failure of the switching is determined.

* * * * *